United States Patent [19]
Hsiao et al.

[11] Patent Number: 6,004,857
[45] Date of Patent: Dec. 21, 1999

[54] METHOD TO INCREASE DRAM CAPACITOR VIA ROUGH SURFACE STORAGE NODE PLATE

[75] Inventors: Yung-Kuan Hsiao; Chen-Jong Wang, both of Hsin-Chu, Taiwan

[73] Assignee: Taiwan Semiconductor Manufacturing Company, Hsin-Chu, Taiwan

[21] Appl. No.: 09/154,846

[22] Filed: Sep. 17, 1998

[51] Int. Cl.⁶ .................................................. H01L 21/70
[52] U.S. Cl. ........................ 438/396; 438/398; 438/255
[58] Field of Search ................................... 438/253, 254, 438/255, 256, 396, 397, 398, 399

[56] References Cited

U.S. PATENT DOCUMENTS

| | | | |
|---|---|---|---|
| 5,110,752 | 5/1992 | Lu | 438/398 |
| 5,182,232 | 1/1993 | Chhabra et al. | 438/255 |
| 5,223,081 | 6/1993 | Doan | 438/398 |
| 5,622,888 | 4/1997 | Sekine et al. | 438/398 |
| 5,656,529 | 8/1997 | Fusake | 438/398 |
| 5,693,557 | 12/1997 | Hirao et al. | 438/398 |
| 5,721,153 | 2/1998 | Kim et al. | |
| 5,721,154 | 2/1998 | Jeng | |
| 5,723,379 | 3/1998 | Watanabe et al. | 438/398 |
| 5,741,734 | 4/1998 | Lee | 438/235 |
| 5,760,434 | 6/1998 | Zahurak et al. | 257/309 |
| 5,763,306 | 6/1998 | Tsai | 438/255 |
| 5,858,838 | 1/1999 | Wang et al. | 438/255 |
| 5,877,063 | 3/1999 | Gilchrist | 438/255 |

*Primary Examiner*—Tuan H. Nguyen
*Attorney, Agent, or Firm*—George O. Saile; Stephen B. Ackerman

[57] ABSTRACT

A process for forming a crown shaped, storage node structure, for a DRAM capacitor structure, with a roughened top surface topology, needed for increased surface area, has been developed. The process features the use of a tungsten silicide layer, used as a component of the storage node structure, with the tungsten silicide layer, subjected to subsequent procedures, providing the roughened top surface topology for the storage node structure. The tungsten silicide layer, after deposition, is subjected to an oxidation procedure, followed by removal of the formed oxide layer, from a bottom portion of unoxidized tungsten silicide layer, resulting in the desired, roughened top surface topology, of the bottom portion of unoxidized tungsten silicide.

24 Claims, 5 Drawing Sheets

METHOD TO INCREASE DRAM CAPACITOR VIA ROUGH SURFACE STORAGE NODE PLATE

BACKGROUND OF THE INVENTION

1. Field of the Invention

The present invention relates to a fabrication process used to create a dynamic random access memory, (DRAM), device, on a semiconductor substrate, and more specifically to a process used to create a storage node structure, with increased surface area.

2. Description of the Prior Art

As the density of DRAM cells increase to levels greater than 1 billion bytes per cell, the area allotted for the DRAM capacitor structure has been decreased. Smaller capacitor structures, presenting decreased capacitor surface area, can result in a decrease in DRAM capacitance, and thus in decreased DRAM performance. Several solutions to the decreasing size of the DRAM capacitor structure, in regards to maintaining, or increasing capacitor surface area, and thus maintaining, or increasing DRAM performance, have been offered. For example the use of a hemispherical grain, (HSG), silicon layer, as a surface layer for a DRAM capacitor, storage node structure, has been used to increase capacitor surface area. The concave and convex features of an HSG silicon layer, used as the surface layer of a storage node structure, offers increased surface area, and thus increased capacitance and DRAM performance, when compared to counterpart storage node structures, fabricated with smooth surfaces. Prior art, such as Tsai, in U.S. Pat. No. 5,763,306, as well as Watanabe et al, in U.S. Pat. No. 5,723,379, describe processes for forming HSG silicon layers, for DRAM capacitor storage node structures, however the procedures needed for successful formation of HSG silicon, are difficult to control. For example the temperature used for HSG silicon formation, comprised of a deposition, and an anneal procedure, have to be controlled to within about 3° C., throughout the used deposition or furnace apparatus, to result in the attainment of a successful HSG silicon layer.

This invention will describe a procedure used to create a DRAM capacitor, storage node structure, with a roughened surface, needed for the increased surface area, and capacitance, however via use of a roughened surface, tungsten silicide layer, rather than the difficult to control HSG silicon layer. The tungsten silicide layer is roughened via subjection to an oxidation procedure, followed by the removal of the previously created oxide layer. This sequence provides a tungsten silicide layer, used as the top layer of a storage node structure, with a roughened top surface, comprised of concave and convex features, thus offering the surface area increases, needed for capacitance and performance improvements.

SUMMARY OF THE INVENTION

It is an object of this invention to create a DRAM capacitor, storage node structure, with a roughened top surface, to increase the surface area of the storage node structure.

It is another object of this invention to use a tungsten silicide layer, as a component of the DRAM capacitor, storage node structure.

It is still yet another object of this invention to oxidize the top portion of the tungsten silicide component, of the DRAM capacitor, storage node structure, followed by removal of the oxide layer, resulting in a roughened surface, for the remaining, unoxidized portion of the tungsten silicide layer.

In accordance with the present invention a process for forming a DRAM capacitor, featuring a roughened top surface topology for the storage node structure, accomplished via the oxidation of a top portion of a tungsten silicide layer, used as a component of the storage node structure, and followed by the removal of the oxide layer, is described. After the creation of a transfer gate transistor, a storage node contact hole is opened in a composite insulator layer, exposing the top surface of source region, of a transfer gate transistor. A doped polysilicon plug is next formed in the storage node contact hole. A capacitor opening is next formed in an insulator layer, exposing the top surface of the doped polysilicon plug. A layer of polysilicon, and an overlying layer of tungsten silicide are next deposited, including deposition on the sides of the capacitor opening, as well as on the bottom of the capacitor opening, with the polysilicon layer overlying, and contacting, the top surface of the doped polysilicon plug. An oxidation procedure is employed, consuming a top portion of the tungsten silicide layer, and creating an oxide layer on the unoxidized, bottom portion of the tungsten silicide layer, with the bottom portion of tungsten silicide, featuring a roughened top surface topology. Removal of the oxide layer is followed by the deposition of a thin polysilicon layer, contouring the underlying, roughened, bottom portion of the tungsten silicide layer, with the thin polysilicon layer still exhibiting the roughened top surface topology of the underlying, bottom portion of tungsten silicide. A chemical mechanical polishing procedure is used to remove materials from the top surface of the insulator layer, resulting in a crown shaped, storage node structure, in the capacitor opening, with the crown shaped. Storage node structure exhibiting a roughened top surface topology, and comprised of: an overlying thin polysilicon layer; a bottom portion of a tungsten silicide layer; and an underlying polysilicon layer. Removal of the insulator layer, from the top surface of the composite insulator layer, is followed by the formation of a capacitor dielectric layer, on the roughened surface of the crown shaped, storage node structure. Formation of an upper polysilicon plate, completes the procedure used to create a DRAM capacitor structure, featuring the roughened surface, crown shaped, storage node structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The process for forming a DRAM capacitor structure, featuring the use of a storage node structure, with a roughened top surface topology, resulting from the oxidation of a portion of a tungsten silicide layer, and the removal of the oxide layer grown on the tungsten silicide layer, where the tungsten silicide layer is used as a component of the storage node structure, will now be described in detail. This invention will be described for a crown shaped, storage node structure, however this invention can be applied to other shaped, storage node structures, as well.

Figure 1:
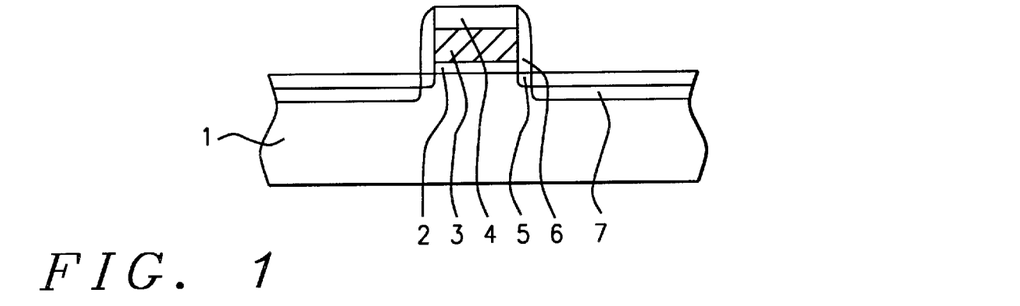
FIGS. 1–10, which schematically, in cross-sectional style, show the creation of the DRAM capacitor structure, in which a storage node structure, with a roughened top surface topology, is used to increase the surface area of the DRAM capacitor structure.

The creation of the transfer gate transistor, used with this invention, is first addressed, and shown schematically in FIG. 1. A semiconductor substrate 1, comprised of P type, single crystalline silicon, having a <100>, crystallographic orientation, is used. A gate insulator 2, comprised of silicon dioxide, obtained via thermal oxidation procedures, to a thickness between about 50 to 200 Angstroms, is next grown. A polysilicon layer 3, is next deposited using low pressure chemical vapor deposition, (LPCVD), to a thickness between about 1500 to 4000 Angstroms. The polysilicon layer can be grown using in situ doping procedures, or grown intrinsically and doped via ion implantation procedures. If desired polysilicon layer 3, can be replaced by a polycide, (metal silicide on polysilicon), layer. This can be accomplished via an LPCVD procedure, used to deposit a thin polysilicon layer, followed by the deposition of an overlying metal silicide layer, such as tungsten silicide. Polycide layers offer lower resistance than polysilicon counterparts, thus resulting in performance enhancements. An insulator layer 4, comprised of silicon oxide, or silicon nitride, is next deposited via LPCVD, or plasma enhanced chemical vapor deposition, (PECVD), procedures, at a thickness between about 500 to 2000 Angstroms. Conventional photolithographic and anisotropic RIE procedures, using $CHF_3$ as an etchant for insulator layer 4, and using $Cl_2$ as an etchant for polysilicon layer 3, are used to create the polysilicon gate structure, shown schematically in FIG. 1. The photoresist shape, used as a mask for polysilicon gate structure patterning, is removed using plasma oxygen ashing and careful wet cleans.

Lightly doped, N type source/drain region 5, is next created via ion implantation of arsenic or phosphorous, at an energy between about 15 to 35 KeV, at a dose between about 1E14 to 1E15 atoms/$cm^2$. Insulator spacers 6, are formed by initially depositing a layer of silicon oxide, using LPCVD or PECVD procedures, to a thickness between about 1000 to 3000 Angstroms, followed by an anisotropic RIE procedure, using $CHF_3$ as an etchant. Insulator spacers 6, can also be comprised of silicon nitride. Heavily doped, N type source and drain region 7, shown schematically in FIG. 1, is next formed via ion implantation of either arsenic or phosphorous, at an energy between about 30 to 50 KeV, at a dose between about 1E15 to 1E16 atoms/$cm^2$.

Figure 2:
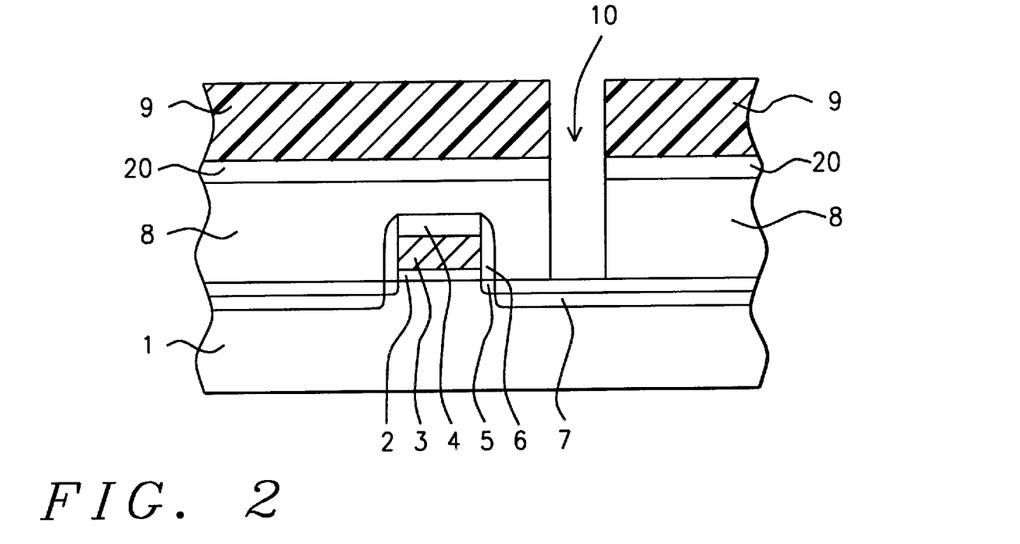

A composite insulator layer, comprised of an underlying silicon oxide layer 8, and an overlying silicon nitride layer 20, is next deposited. Silicon oxide layer 8, is first deposited, via LPCVD or PECVD procedures, to a thickness between about 5000 to 8000 Angstroms. A planarization procedure, performed using chemical mechanical polishing, is employed to create a smooth top surface topography for silicon oxide layer 8. Next silicon nitride layer 20, shown schematically in FIG. 2, is deposited, via LPCVD or PECVD procedures, to a thickness between about 200 to 700 Angstroms. Photoresist shape 9, is next used as a mask, to allow an anisotropic, reactive ion etching, (RIE), procedure, using $SF_6$—HBr—He as an etchant for silicon nitride layer 20, and using $CHF_3$ as an etchant for silicon oxide layer 8, to open storage node contact hole 10. Storage node contact hole 10, shown schematically in FIG. 2, exposes the top surface of a heavily doped, N type source/drain region 7.

Figure 3:
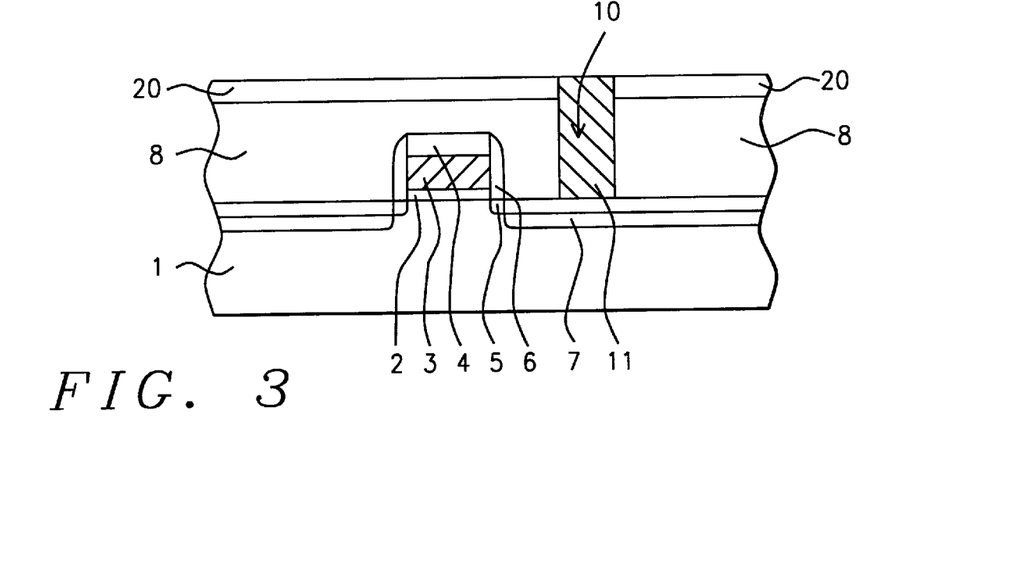

After removal of the photoresist shape 9, used for definition of storage node contact hole 10, via plasma oxygen ashing and careful wet cleans, a polysilicon layer is deposited using LPCVD procedures, to a thickness between about 1800 to 3000 Angstroms, completely filling storage node contact hole 10. The polysilicon layer can be deposited using in situ doping procedures, via the addition of either phosphine or arsine, to a silane source, or the polysilicon layer can be deposited intrinsically, and doped via ion implantation procedures, using either arsenic or phosphorous. Removal of the polysilicon layer, from the top surface of silicon nitride layer 20, via an anisotropic RIE procedure, using $Cl_2$ as an etchant, or via a chemical mechanical polishing procedure, results in the formation of doped polysilicon plug 11, located in storage node contact hole 10, contacting heavily doped, N type source/drain region 7. This is schematically shown in FIG. 3.

Figure 4:
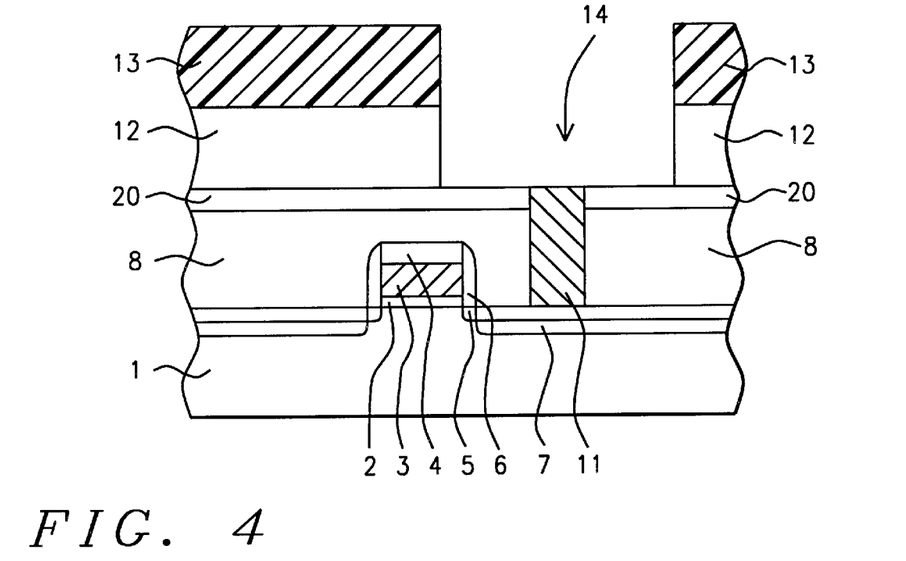

The formation of the opening, needed to create the crown shaped structure, is next addressed, and described in FIG. 4. An insulator layer 12, comprised of silicon oxide, is deposited using LPCVD or PECVD procedures, to a thickness between about 5000 to 15000 Angstroms, using tetraethylorthosilicate, (TEOS), as a source. Photoresist shape 13, is next formed on underlying insulator layer 12, and used as a mask, to allow an anisotropic RIE procedure, using $CHF_3$ as an etchant, to create capacitor opening 14, in insulator layer 12. The top surface of doped polysilicon plug 11, as well as a portion of the top surface of silicon nitride layer 20, are exposed in opening 14.

Figure 5:
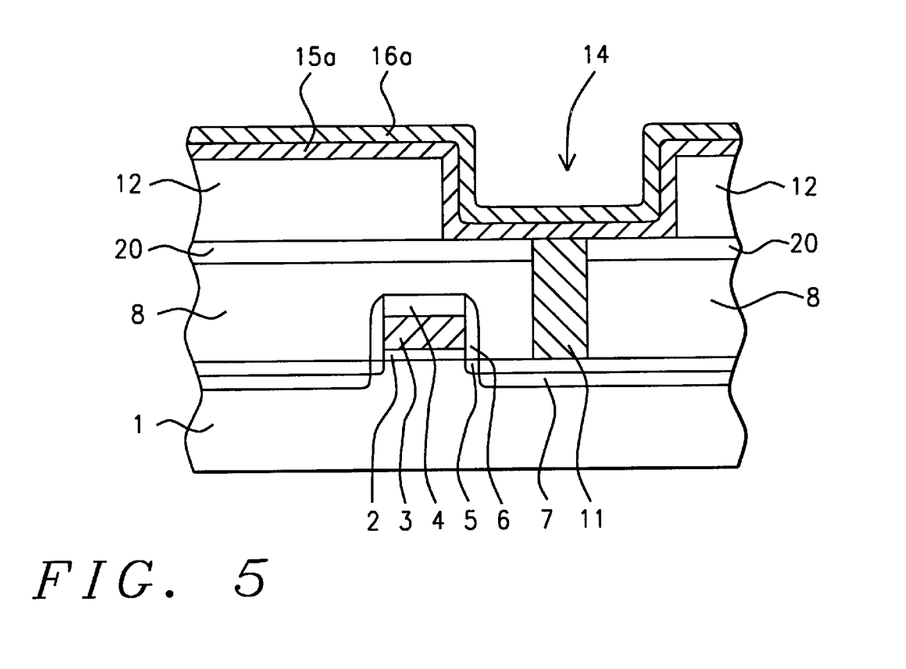

After removal of photoresist shape 13, via plasma oxygen ashing and careful wet cleans, polysilicon layer 15a, is deposited, via LPCVD procedures, to a thickness between about 300 to 2000 Angstroms. Polysilicon layer 15a, shown schematically in FIG. 5, can be doped in situ, during deposition, via the addition of arsine, or phosphine, to a silane ambient, or polysilicon layer 15a, can be deposited intrinsically, and doped via ion implantation procedures, using arsenic or phosphorous ions. Polysilicon layer 15a, shown schematically in FIG. 5, overlays the top surface of insulator layer 12, in addition to coating the sides of capacitor opening 14. Polysilicon layer 15a, also overlies and contacts, the top surface of doped polysilicon plug 11, at the bottom of opening 14. A tungsten silicide layer 16a, also schematically shown FIG. 5, is next deposited, on polysilicon layer 15a, via LPCVD procedures, to a thickness between about 500 to 2000 Angstroms, using silane and tungsten hexafluoride as reactants.

Figure 6:
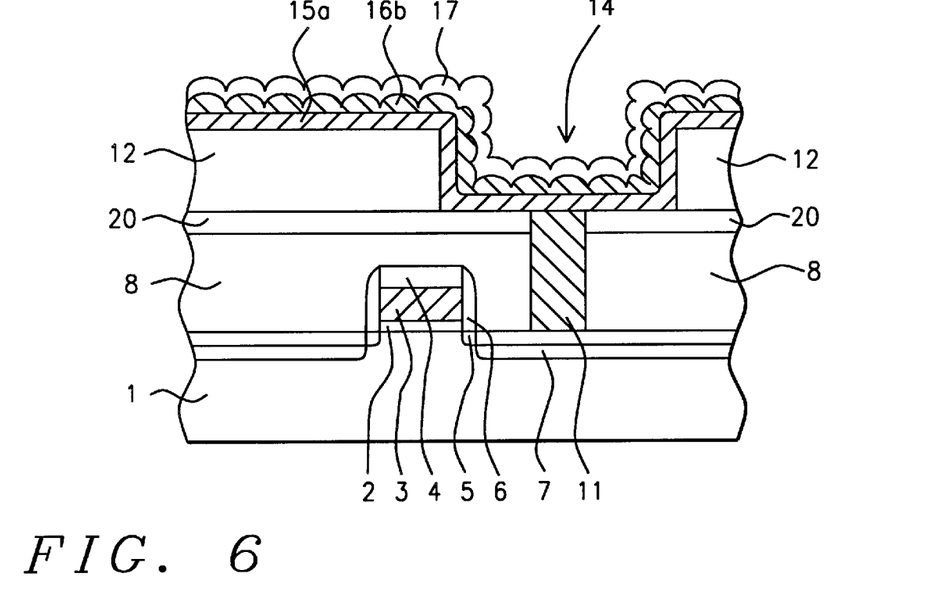

FIG. 6, schematically describes the critical procedures used to create the roughened top surface topology, of tungsten silicide, needed to increase the surface area of a subsequent storage node structure. First a thermal oxidation procedure, performed at a temperature between about 650 to 1000° C., in an oxygen—steam ambient, results in the formation of oxide layer 17, comprised of silicon oxide, at a thickness between about 20 to 500 Angstroms. The formation of oxide layer 17, consuming a top portion of tungsten silicide layer 16a, results in the creation of bottom tungsten silicide layer 16b, still remaining, overlying polysilicon layer 15a. Bottom tungsten silicide layer 16b, between about 300 to 2000 Angstroms, exhibits a roughened top surface topology, as a result of leaching of silicon, from the remaining bottom portion of the tungsten silicide layer.

Figure 7:
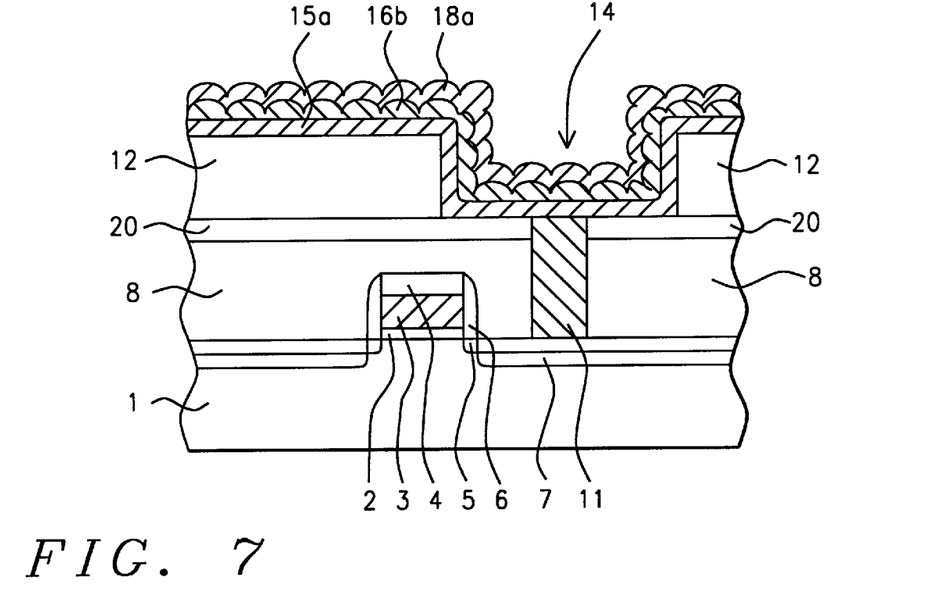

Oxide layer 17, is next removed using a buffered hydrofluoric acid solution. The result of this procedure is schematically shown in FIG. 7. Oxide layer 17, can also be removed via a selective RIE procedure, using $CHF_3$ as an etchant. Next a thin polysilicon layer 18a, is deposited via LPCVD procedures, to a thickness between about 100 to 1000 Angstroms. Polysilicon layer 18a, is doped in situ, during deposition, via the addition of arsine, or phosphine, to a silane ambient. Thin polysilicon layer 18a, shown schematically in FIG. 7, conformally contours the topology of underlying bottom tungsten silicide layer 16b, therefore still exhibiting the desired roughened topology, creating in the underlying layer.

Figure 8:
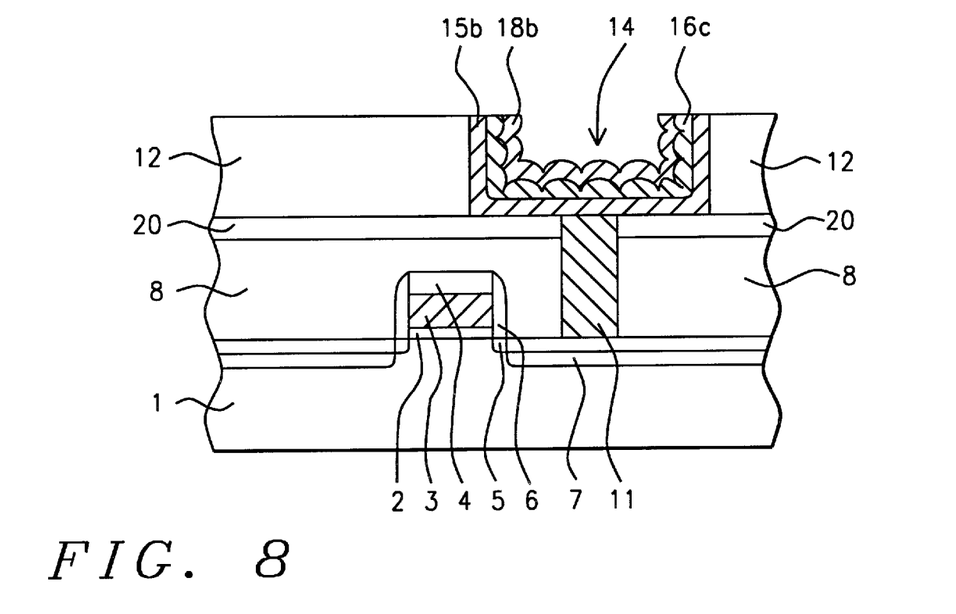
Figure 9:
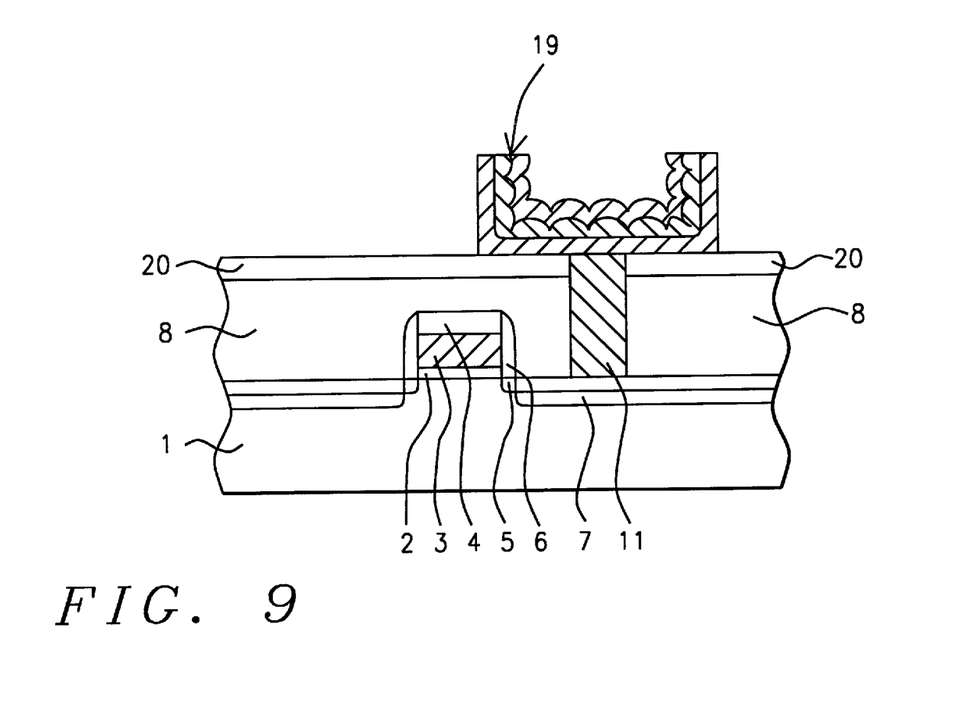

Removal of regions of thin polysilicon layer 18a, bottom tungsten silicide layer 16b, and polysilicon layer 15a, overlying the top surface of insulator layer 12, is next accomplished via a chemical mechanical polishing, (CMP). procedure. The CMP procedure results in the formation of a crown shaped, a storage structure, in capacitor opening 14, comprised of overlying, thin polysilicon component 18b, bottom tungsten silicide component 16c, and underlying polysilicon component 15b. This is schematically shown in FIG. 8. Selective removal of insulator shape 12, from the top surface of silicon nitride layer 20, via use of a buffered hydrofluoric acid solution, results in the crown shaped, storage node structure 19, featuring a roughened top surface topology, comprised of thin polysilicon component 18b—bottom tungsten silicide component 16c—polysilicon component 15b, overlying, and connected to, doped polysilicon plug 11. This is schematically shown in FIG. 9.

Figure 10:
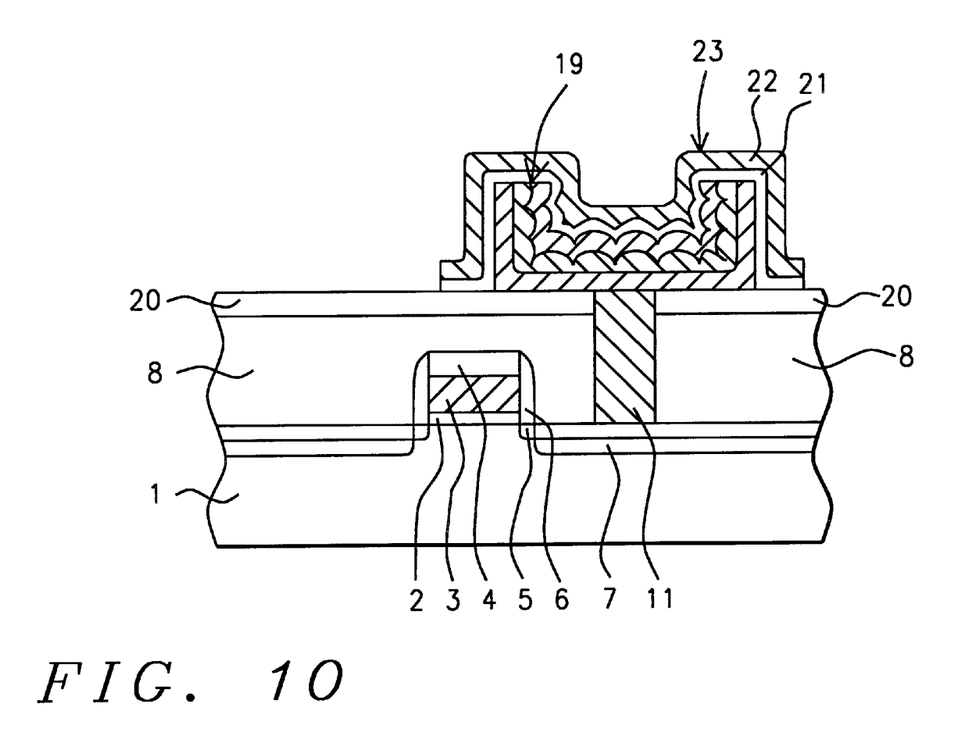

A capacitor dielectric layer 20 is next formed on the top surface of crown shaped, storage node structure 19. Capacitor dielectric layer 17, is a composite dielectric layer of silicon oxynitride—silicon nitride—silicon oxide, (ONO), at an equivalent silicon oxide thickness of between about 40 to 80 Angstroms. The ONO layer is created by initially creating a native, silicon oxide layer, between about 10 to 30 Angstroms in thickness, on the roughened top surface, of crown shaped, storage node structure 19. A thin layer of silicon nitride is next deposited, using LPCVD procedures, to a thickness between about 30 to 50 Angstroms. An oxidation procedure, performed in an oxygen—steam ambient, is next used to convert the surface of the silicon nitride layer, to a silicon oxynitride layer, thus creating the ONO layer 21, overlying crown shaped, storage node structures 19. After creation of the capacitor dielectric layer, another polysilicon layer is deposited, via LPCVD procedures, to a thickness between about 500 to 2000 Angstroms. The polysilicon layer can be in situ doped, during deposition, via the addition of arsine, or phosphine, to a silane ambient, or the polysilicon layer, can be grown intrinsically and doped via ion implantation procedures, using arsenic or phosphorous. Patterning of the polysilicon layer is next performed, via conventional photolithographic and anisotropic RIE procedures, using $Cl_2$ as an etchant, creating polysilicon upper plate 22, shown schematically shown in FIG. 10, and completing the formation of DRAM capacitor structure 23, comprised of polysilicon upper plate 22, on capacitor dielectric layer 21, and underlying crown shaped, storage node structure 19, with crown shaped, storage node structure 19, exhibiting a roughened top surface topology, as a result of a roughened top surface topology for a tungsten silicide layer, used as a component of the storage node structure. The photoresist shape, used as a mask for definition of polysilicon upper plate 22, is once again accomplished via plasma oxygen ashing and careful wet cleans.

While this invention has been particularly shown and described with reference to the preferred embodiments thereof, it will be understood by those skilled in the art that various changes in form and details may be made without departing from the spirit and scope of the invention.

What is claimed is:

1. A method of creating a capacitor structure, for dynamic random access memory (DRAM) devices, on a semiconductor substrate, comprising the steps of:

providing a transfer gate transistor, on said semiconductor substrate, comprised of a polysilicon gate structure, on a gate insulator layer, with a source/drain region, in a region of said semiconductor substrate, not covered by said polysilicon gate structure;

forming a storage node contact hole, in a composite insulator layer, exposing a source region, of said source/drain region;

forming a doped polysilicon plug, in said storage node contact hole, contacting said source region;

depositing a thick insulator layer;

forming a capacitor opening in said thick insulator layer, exposing the top surface of said doped polysilicon plug;

depositing a first polysilicon layer, on the top surface of said thick insulator layer, on the surfaces of said thick insulator, exposed in said capacitor opening, and on the top surface of said doped polysilicon plug, exposed in the bottom of said capacitor opening;

depositing a metal silicide layer on said first polysilicon layer;

performing an oxidization procedure to create an oxide layer, consuming a top portion of said metal silicide layer, with said oxide layer overlying a bottom portion of unoxidized metal silicide layer;

removing said oxide layer from the top surface of said bottom portion of said unoxidized metal silicide layer;

depositing a second polysilicon layer on said bottom portion of said unoxidized metal silicide layer;

removing said second polysilicon layer, said bottom portion of said unoxidized metal silicide layer, and said first polysilicon layer, from the top surface of said thick insulator layer, creating a storage node structure, in said capacitor opening, with said storage node structure overlying, and contacting, the top surface of said doped polysilicon plug, and with said storage node structure comprised of: overlying, of said record polysilicon layer; said bottom portion of said unoxidized metal silicide layer; and of underlying, said first polysilicon layer;

removing said thick insulator layer, from the top surface of said composite insulator layer;

forming a capacitor dielectric layer on said storage node structure; and forming a polysilicon upper electrode structure, on said capacitor dielectric layer.

2. The method of claim 1, wherein said composite insulator layer is comprised of an underlying silicon oxide layer, obtained via LPCVD or PECVD procedures, to a thickness between about 500 to 8000 Angstroms, and an overlying silicon nitride layer, obtained via LPCVD or PECVD procedures, to a thickness between about 200 to 700 Angstroms.

3. The method of claim 1, wherein said doped polysilicon, plug is created from a polysilicon layer, obtained via LPCVD procedures, at a thickness between about 1800 to 3000 Angstroms, and either doped in situ, during deposition, via the addition of either arsine or phosphine, to a silane ambient, or the polysilicon layer is deposited intrinsically, and doped via ion implantation of arsenic or phosphorous ions.

4. The method of claim 1, wherein said thick insulator layer is a silicon oxide layer, obtained via LPCVD or PECVD procedures, to a thickness between about 5000 to 15000 Angstroms, using TEOS as a source.

5. The method of claim 1, wherein said opening, in said thick insulator layer, is formed via an anisotropic RIE procedure, using $CHF_3$ as an etchant.

6. The method of claim 1, wherein said first polysilicon layer is deposited via LPCVD procedures, to a thickness between about 300 to 2000 Angstroms, and doped in situ, during deposition, via the addition of arsine or phosphine, to a silane ambient, or grown intrinsically, and then doped via an ion implantation procedure, using arsenic or phosphorous ions.

7. The method of claim 1, wherein said metal silicide layer, is a tungsten silicide layer, obtained via LPCVD procedures, at a thickness between about 500 to 2000 Angstroms, using silane and tungsten hexafluoride as reactants.

8. The method of claim 1, wherein said oxide layer is silicon oxide, obtained via a thermal oxidation procedure, in an oxygen—steam ambient, at a temperature, between about 650 to 1000° C.

9. The method of claim 1, wherein said oxide layer is removed using a buffered hydrofluoric acid solution, or via a selective RIE procedure.

10. The method of claim 1, wherein said bottom portion of said unoxidized metal silicide layer, is comprised of tungsten silicide, at a thickness between about 300 to 2000 Angstroms.

11. The method of claim 1, wherein said second polysilicon layer is obtained via LPCVD procedures, to a thickness between about 100 to 1000 Angstroms, and in situ doped, during deposition, via the addition of arsine or phosphine, to a silane ambient.

12. The method of claim 1, wherein said storage node structure, can be a crown shaped, storage node structure.

13. The method of claim 1, wherein said capacitor dielectric layer is a silicon oxynitride—silicon nitride—silicon oxide layer, (ONO), at an equivalent silicon dioxide thickness between about 40 to 80 Angstroms, created by an initial thermal oxidation to form a silicon oxide layer, between about 10 to 30 Angstroms, followed by a deposition of silicon nitride, to a thickness between about 30 to 50 Angstroms, and thermal oxidation of said silicon nitride layer, creating a silicon oxynitride layer, on the underlying, said silicon oxide layer.

14. A method for fabricating a crown shaped, storage node structure, for a DRAM capacitor, featuring increased surface area, accomplished via use of tungsten silicide layer, used as a component of said crown shaped, storage node structure, wherein said tungsten silicide layer is subjected to an oxidation procedure, and an oxide removal procedure, creating a roughened top surface topology for said crown shaped, storage node structure, comprising the steps of:

providing a transfer gate transistor, comprised of a polysilicon gate structure, on a gate insulator layer, with a source/drain region, in a region of said semiconductor substrate, not covered by said polysilicon gate structure;

providing a storage node contact hole, in a composite insulator layer, exposing a source region, of said source/drain region, located at the bottom of said storage node contact hole;

forming a doped polysilicon plug, in said storage node contact hole;

depositing a thick silicon oxide layer;

forming a capacitor opening in said thick silicon oxide layer, exposing the top surface of said doped polysilicon plug;

depositing a first polysilicon layer on the top surface of said thick silicon oxide layer, and on the surfaces of said thick silicon oxide layer, exposed in said capacitor opening, including deposition on the top surface of said doped polysilicon plug, exposed at the bottom of said capacitor opening;

depositing said tungsten silicide layer on said first polysilicon layer;

performing an oxidation procedure, to convert a top portion of said tungsten silicide layer to an oxide layer, while leaving a bottom portion of said tungsten silicide layer, unoxidized, and with said bottom portion of said tungsten silicide layer, exhibiting a roughened top surface topology;

removing said oxide layer from said roughened top surface topology, of said bottom portion of said tungsten silicide layer;

depositing a second polysilicon layer, on said bottom portion of said tungsten silicide layer, with the top surface of said second polysilicon layer exhibiting the same roughened top surface topology as that of underlying, said bottom portion of said tungsten silicide layer;

removing said second polysilicon layer, said bottom portion of said tungsten silicide layer, and said first polysilicon layer, from the top surface of said thick silicon oxide layer, resulting in said crown shaped, storage node structure, in said capacitor opening, overlying, and contacting, the top surface of said polysilicon plug, and with said crown shaped, storage node structure comprised of: said second polysilicon layer; of said bottom portion of said tungsten silicide layer; and of said first polysilicon layer;

removing said thick silicon oxide layer from the top surface of said composite insulator layer;

forming a capacitor dielectric layer, on said crown shaped, storage node structure; and forming a polysilicon upper plate, on said capacitor dielectric layer.

15. The method of claim 14, wherein said doped polysilicon plug is formed from a polysilicon layer, deposited using an LPCVD procedure, at a thickness between about 1800 to 3000 Angstroms, and doped in situ, during deposition, via the addition of arsine or phosphine, to a silane ambient, or deposited intrinsically, and doped via ion implantation of arsenic or phosphorous ions.

16. The method of claim 14, wherein said thick silicon oxide layer is deposited using LPCVD or PECVD procedures, to a thickness between about 5000 to 15000 Angstroms.

17. The method of claim 14, wherein said opening, in said thick silicon oxide layer, is created via an anisotropic RIE procedure, using $CHF_3$ as an etchant.

18. The method of claim 14, wherein said first polysilicon layer is deposited using LPCVD procedures, to a thickness between about 300 to 2000 Angstroms, and doped either during deposition, via an in situ doping procedure, via the addition of arsine, or phosphine, to a silane ambient, or deposited intrinsically and doped via ion implantation of arsenic or phosphorous ions.

19. The method of claim 14, wherein said tungsten silicide layer is obtained via LPCVD procedures, at a thickness between about 500 to 2000 Angstroms, using silane and tungsten hexafluoride as reactants.

20. The method of claim 14, wherein said oxide layer, is silicon oxide, at a thickness between about 20 to 500 Angstroms, obtained via thermal oxidation procedures, in an oxygen—steam ambient, at a temperature between about 650 to 1000° C.

21. The method of claim 14, wherein said oxide layer is removed using a buffered hydrofluoric acid solution, or via a selective RIE procedure, using $CHF_3$ as an etchant.

22. The method of claim 14, wherein said bottom portion of said tungsten silicide layer, is between about 300 to 2000 Angstroms in thickness.

23. The method of claim 14, wherein said second polysilicon layer is obtained via LPCVD procedures, at a thickness between about 100 to 1000 Angstroms, and doped in situ, during deposition, via the addition of arsine, or phosphine, to a silane ambient.

24. The method of claim 14, wherein said capacitor dielectric layer is a silicon oxynitride—silicon nitride—silicon oxide, (ONO), layer, at an equivalent silicon oxide thickness between about 40 to 80 Angstroms, created by an initial thermal oxidation to form a silicon oxide layer, between about 10 to 30 Angstroms, followed by a deposition of silicon nitride, to a thickness between 30 to 50 Angstroms, and thermal oxidation of said silicon nitride layer, creating a silicon oxynitride layer on the underlying said silicon oxide layer.

* * * * *